United States Patent
Liu et al.

(10) Patent No.: US 8,450,722 B2
(45) Date of Patent: May 28, 2013

(54) MAGNETORESISTIVE RANDOM ACCESS MEMORY AND METHOD OF MAKING THE SAME

(75) Inventors: Ming-Te Liu, Taipei (TW); Tien-Wei Chiang, Hsinchu (TW); Ya-Chen Kao, Fuxing Township (TW); Wen-Cheng Chen, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 110 days.

(21) Appl. No.: 13/183,968

(22) Filed: Jul. 15, 2011

(65) Prior Publication Data

US 2013/0015538 A1 Jan. 17, 2013

(51) Int. Cl.
*H01L 29/82* (2006.01)
*H01L 27/22* (2006.01)
(52) U.S. Cl.
USPC ...... 257/30; 257/422; 257/427; 257/E27.006; 365/158; 365/173
(58) Field of Classification Search
USPC ............ 257/30, 422, 427, E27.006; 365/158, 365/173
See application file for complete search history.

(56) References Cited

U.S. PATENT DOCUMENTS

| 7,020,009 B2* | 3/2006 | Ho et al. ................ 365/158 |
| 7,515,458 B2* | 4/2009 | Hung et al. ............. 365/158 |
| 2010/0044667 A1* | 2/2010 | Park et al. ................ 257/2 |
| 2011/0164448 A1* | 7/2011 | Sato et al. .............. 365/158 |
| 2012/0002330 A1* | 1/2012 | Matsuzawa et al. ..... 360/313 |

OTHER PUBLICATIONS

Li, Hai et al., "Thermal-Assisted Spin Transfer Torque Memory (STT-RAM0 Cell Design Exploration", 2009 IEEE Computer Society Annual Symposium on VLSI, pp. 217-222.
Liu, Luqiao et al., "Reduction of the Spin-Torque Critical Current by Partially Canceling the Free Layer Demagnetization Field", Applied Physics Letters 94, 122508, 2009.
Law, Randall, et al., "Reduction in Critical Current for Spin Transfer Switching in Perpendicular Anisotropy Spin Valves Using an In-Plane Spin Polarizer", Applied Physics Letters 94, 062516, 2009.

* cited by examiner

*Primary Examiner* — Ngan Ngo
(74) *Attorney, Agent, or Firm* — Lowe Hauptman Ham & Berner, LLP (57) ABSTRACT

A magnetoresistive random access memory (MRAM) cell includes a magnetic tunnel junction (MTJ), a top electrode disposed over the MTJ, a bottom electrode disposed below the MTJ, and an induction line disposed to one side of the MTJ. The induction line is configured to induce a perpendicular magnetic field at the MTJ.

20 Claims, 8 Drawing Sheets

MAGNETORESISTIVE RANDOM ACCESS MEMORY AND METHOD OF MAKING THE SAME

TECHNICAL FIELD

The present disclosure relates generally to an integrated circuit and, more particularly, a Magnetoresistive Random Access Memory (MRAM).

BACKGROUND

A Magnetoresistive Random Access Memory (MRAM) stores data in magnetic storage elements, e.g., magnetic tunnel junctions (MTJs). The reading of the MRAM is accomplished by measuring the electrical resistance of the MRAM cell, which changes according to the magnetic field polarities of the MTJ in the MRAM cell. Data is written to the MRAM cells by storing a magnetic field polarity in the MTJ by using an electrical current (a threshold/critical current). The threshold current affects the power consumption of the MRAM.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

Figure 1:
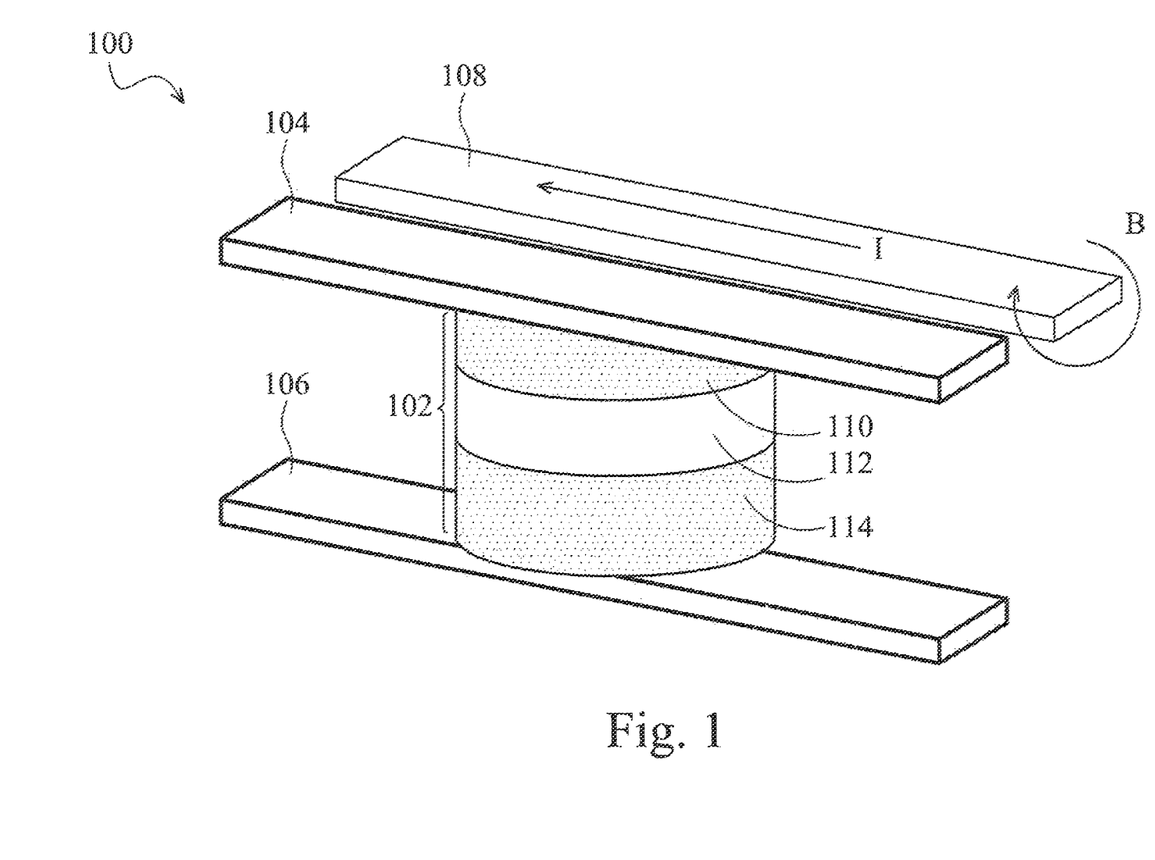
FIG. 1 is a perspective view of an exemplary MRAM cell according to some embodiments.

FIG. 1 is a perspective view of an exemplary MRAM cell according to some embodiments. The MRAM cell 100 has an MTJ 102, a top electrode 104, a bottom electrode 106, and a (magnetic field) induction line 108. The MTJ 102 comprises a free layer 110, an insulator (spacer, or tunnel barrier) 112, and a fixed layer 114. The induction line is located to one side of the MTJ 102.

The free layer 110 and the fixed layer 114 form two ferromagnetic plates, each of which can hold a magnetic field, separated by a thin insulator 112. The fixed layer 114 has a fixed magnetic polarity, and the free layer 110 has a changeable magnetic polarity to match an external field to store data. Due to a magnetic tunnel effect, the electrical resistance of the MTJ 102 changes based on the orientation of the magnetic fields in the two plates, i.e., the free layer 110 and the fixed layer 114. The MTJ 102 has lower resistance if the two plates have the same polarity and higher resistance if the two plates are of opposite polarity in some embodiments.

The MTJ 102 can be manufactured with thin film technology, such as magnetron sputter deposition, molecular beam epitaxy, pulsed laser deposition, electron beam physical vapor deposition, or any other suitable methods. The MTJ 102 is shown to have an oval or elliptic shape, and has different shapes in other embodiments.

The MRAM cell 100 can be fabricated by photolithography processes, as described below in FIGS. 2A-2I. The free layer 110 comprises magnetic material, e.g., CoFeB, NiFe, with a thickness of about 15-25 angstroms (Å), while the fixed layer 114 comprises magnetic material, e.g., CoFe, CoFeB, with a thickness of about 40-60 Å (thicker than the free layer 110) in some embodiments. The insulator 112 comprises MgO, $Al_2O_3$, or any other suitable material.

The top electrode 104, the bottom electrode 106, and the induction line 108 can comprise electrically conductive material, such as copper, copper alloy, aluminum, aluminum/silicon/copper alloy, titanium, titanium nitride, tantalum, tantalum nitride, tungsten, polysilicon, metal silicide, any combinations thereof or any other suitable material. The top electrode 104, the bottom electrode 106, and the induction line 108 are formed by a process including physical vapor deposition (PVD such as PVD by sputtering), chemical vapor deposition (CVD), plating, damascene processes, combinations thereof, or any other suitable processes. The induction line 108 can be also formed from the same layer as the MTJ 102 in some embodiments.

The MRAM cell 100 shows the direction of a current I on the induction line 108 and the induced magnetic field B from the induction line 108 by the current I. The induced magnetic field B is perpendicular with respect to the magnetic field of the MTJ 102. The induced perpendicular magnetic field contributes to decrease the threshold (switching, or critical) current for writing of the MRAM cell 100, thus reducing power consumption.

Compared to a thermal assisted (TA) or Joule heating writing method, the MRAM cell 100 does not require a long heating time that is needed for those methods. Also, compared to a writing method using a perpendicular magnetic layer structure, the MRAM cell 100 is more economical.

In the embodiment in FIG. 1, the induction line 108 is positioned beside the top electrode 104, but the induction line 108 can be located in other places, in order to induce a perpendicular magnetic field at the MTJ 102, e.g., above or beside the bottom electrode 106 to one side of the MTJ 102, or above the top electrode 104 to one side of the MTJ 102, etc. Also, the induction line 108 can be formed using the same layer as any of the top electrode 104, the MTJ 102, the bottom electrode 106, or in any other electrically conductive layer that can induce a perpendicular magnetic field at the MTJ 102.

Figure 2A:
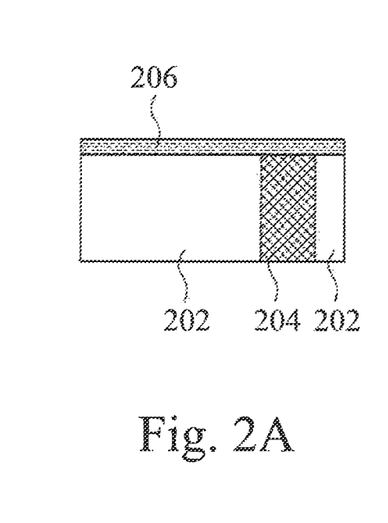
FIGS. 2A-2I are cross-sectional views of the exemplary MRAM cell in FIG. 1 at various fabrication stages according to some embodiments.
Figure 2B:
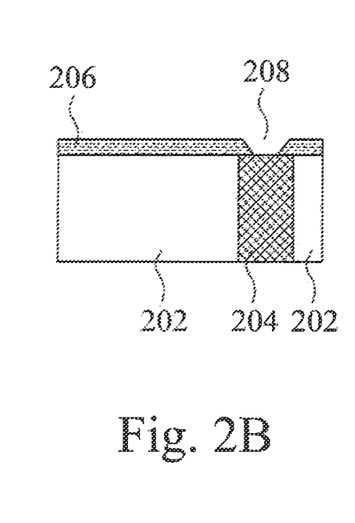

FIGS. 2A-2I are cross-sectional views of the exemplary MRAM cell in FIG. 1 at various fabrication stages according to some embodiments. FIG. 2A is a cross-sectional view of a dielectric layer 202 (e.g., $SiO_2$) deposited over a substrate (not shown), a metal connection 204 (e.g., via), and an insulation layer 206 (e.g., SiC, $SiO_2$, etc.). In FIG. 2B, an opening 208 is formed for an electrical connection by etching a portion of the insulation layer 206.

Figure 2C:
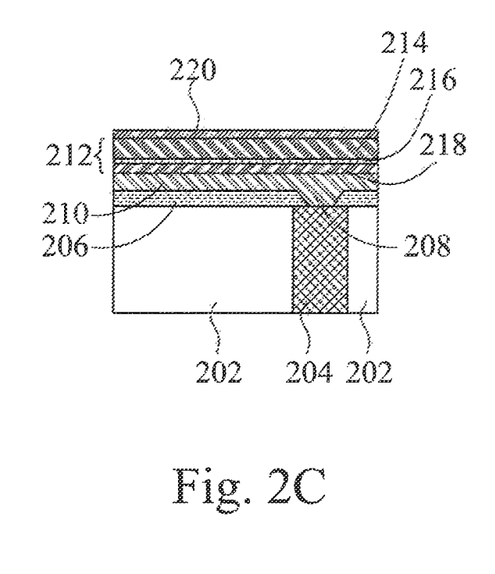

In FIG. 2C, the bottom electrode layer 210 is deposited over the insulation layer 206 and the electrical connection is made at the opening 208 between the bottom electrode layer 210 and the metal connection 204. Also MTJ layers 212 are deposited over the bottom electrode layer 210, which includes a free layer 214, an insulator 216, and the fixed layer 218. (The thin insulator 216 is between the free layer 214 and the fixed layer 218). A hard mask layer 220 is deposited over the MTJ layers 212.

Figure 2D:
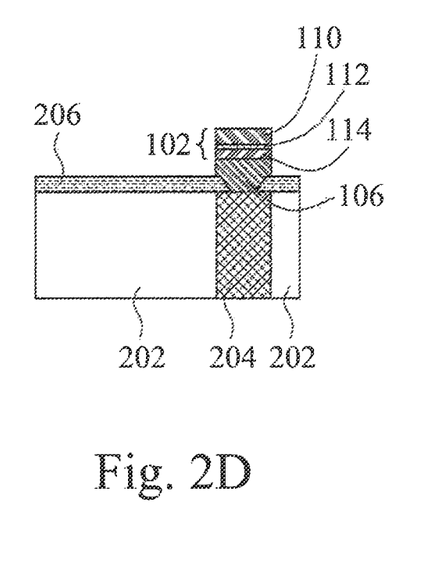
Figure 2E:
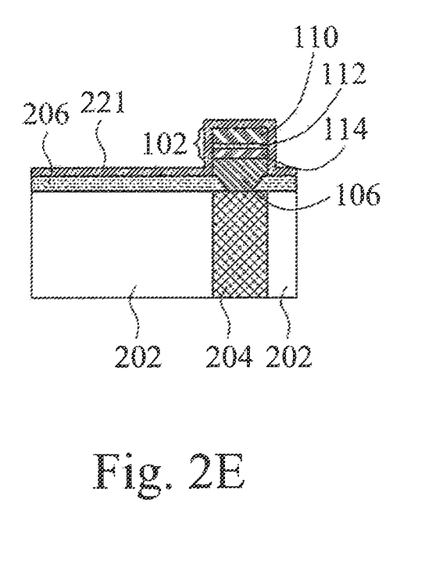
Figure 2F:
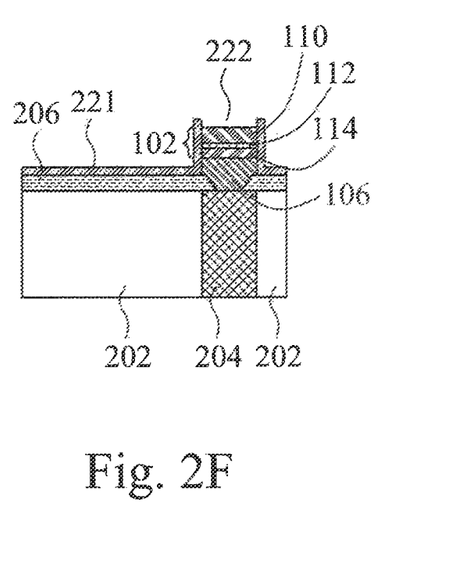
Figure 2G:
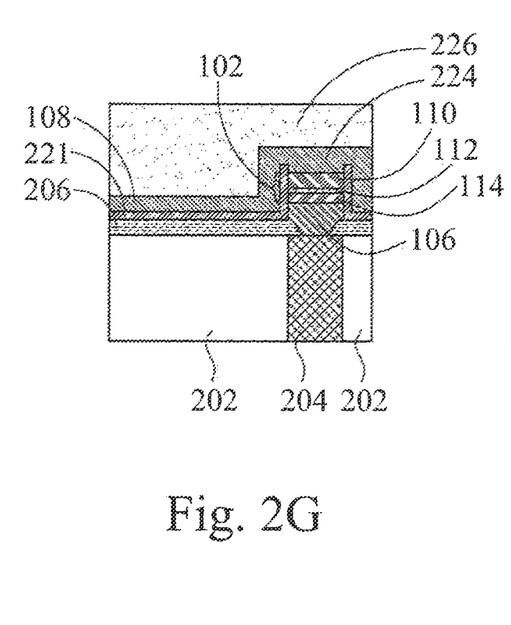

In FIG. 2D, the MTJ 102 is formed above the metal connection 204 and by etching a portion of the MTJ layers 212, which shapes the free layer 110, the insulator 112, the fixed layer 114, and the bottom electrode 106. The hard mask layer 220 is patterned and used as a mask for patterning the MTJ layers 212, and the hard mask layer 220 is removed after the formation of the MTJ 102. In FIG. 2E, a sidewall spacer layer 221 (e.g. SiN) is deposited over the insulator 206 and the MTJ 102. In FIG. 2F, an opening 222 is formed above the MTJ 102 by etching part of the sidewall spacer layer 221. In FIG. 2G, a top electrode layer 224 is deposited over the insulator 206 and the MTJ 102 and a hard mask layer 226 is deposited over the top electrode layer 224.

Figure 2H:
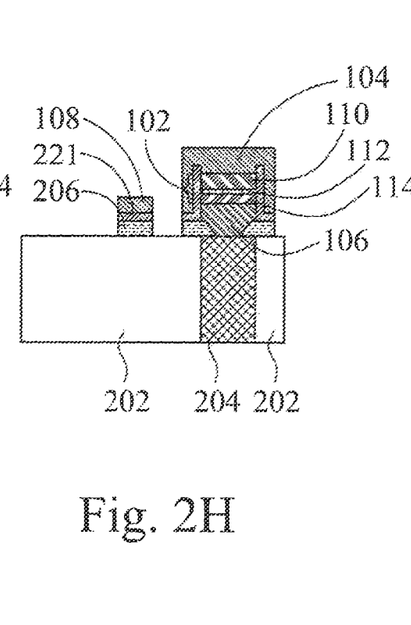

In FIG. 2H, the top electrode layer 224 is etched to form the top electrode 104 and the induction line 108. In another example, the bottom electrode layer 210 (shown in FIG. 2C) can be etched to form an induction line. In yet another example, both the top electrode layer 224 and the bottom electrode layer 210 can be etched to form induction lines. In yet another example, the MTJ layer 212 (shown in FIG. 2C) can be etched to form an induction line.

Figure 2I:
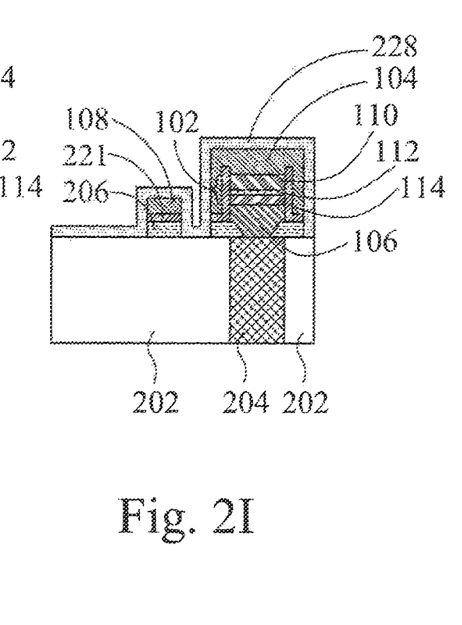

In FIG. 2I, a protection film 228 (e.g., SiC) is deposited over the structure in FIG. 2H, A person skilled in the art would appreciate that there can be various methods to fabricate the MRAM cell 100 and the induction line 108 in different embodiments. Some examples are described in FIGS. 3-4.

Figure 3:
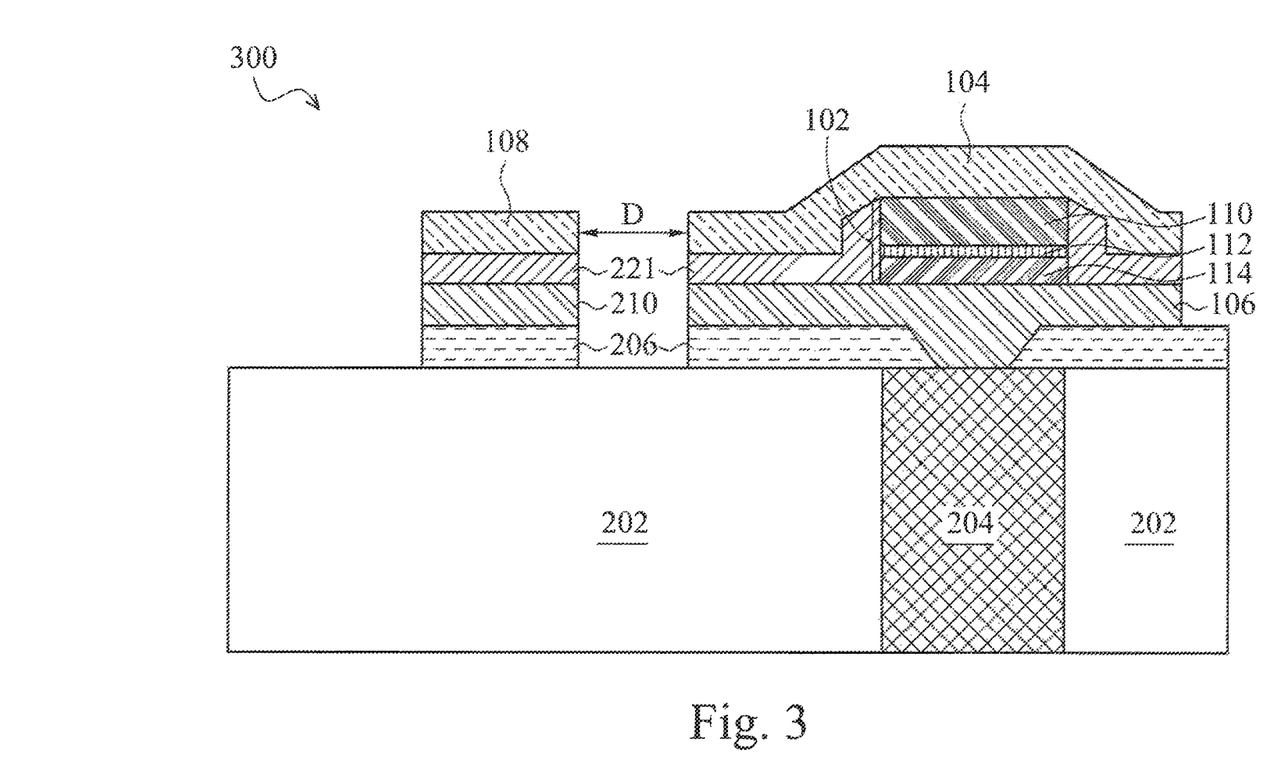
FIG. 3 is a cross-sectional view of an exemplary MRAM cell structure according to some embodiments.

FIG. 3 is a cross-sectional view of an exemplary MRAM cell structure according to some embodiments. The MRAM cell structure 300 is similar to the structure in FIG. 2H, except that the bottom electrode layer 210 (which can be also used as an induction line) remains under the induction line 108. The MRAM cell structure 300 can be fabricated by selectively etching the structure in FIG. 2C to leave different parts of the bottom electrode layer 210.

The induced magnetic field B from the induction line 108 is approximately given by the equation $B=\mu_0 I/(2\pi D)$, where $\mu_0$ is a magnetic constant of free space and D is the distance between the induction line 108 and the top electrode 104 for the MTJ 102. In one exemplary spin transfer torque (STT) MRAM cell having a structure similar to the MRAM cell structure 300, when D is 50 nm and induction line current is 0.8 mA, the induced magnetic field B is about 100 Oe. In this example, the threshold current can be reduced about 10-20% compared to a (STT) MRAM cell structure without the induction line 108.

Figure 4:
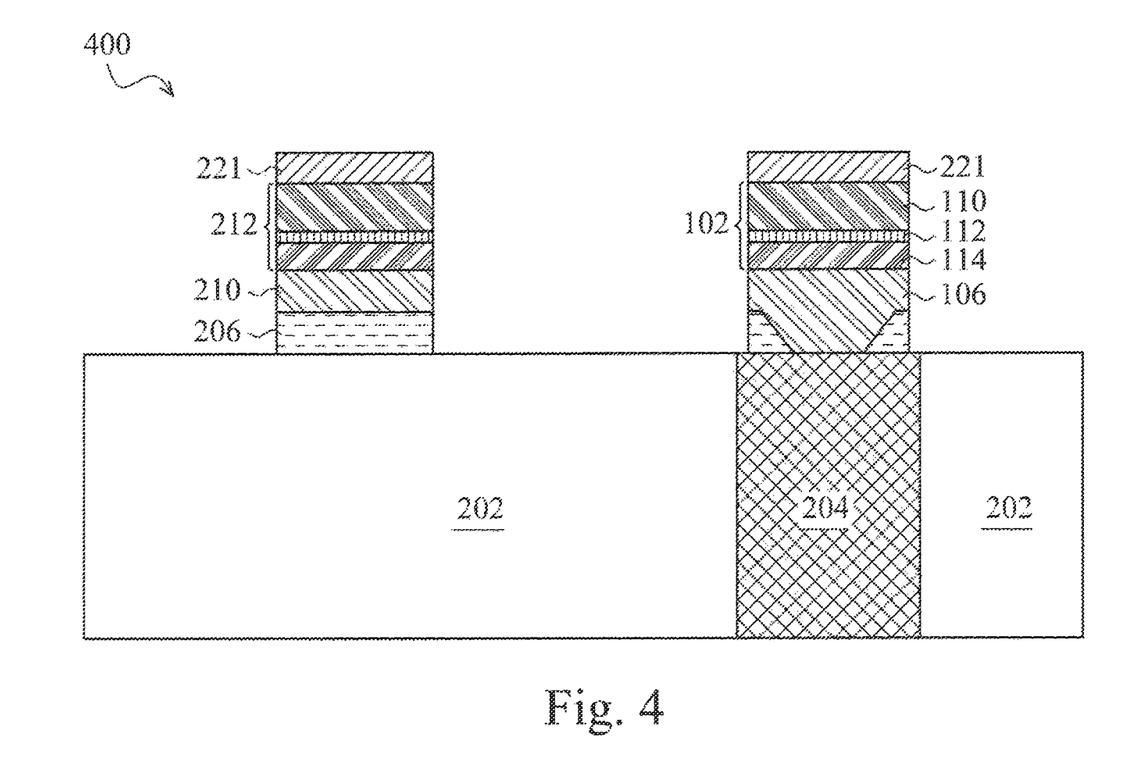
FIG. 4 is a cross-sectional view of another exemplary MRAM cell structure according to sonic embodiments.

FIG. 4 is a cross-sectional view of another exemplary MRAM cell structure according to some embodiments. The MTJ 102 in the MRAM cell structure 400 can be formed by selectively etching the structure in FIG. 2C. The remaining MTJ layers 210 to the left side of the MTJ 102 can be used as an induction line.

Figure 5:
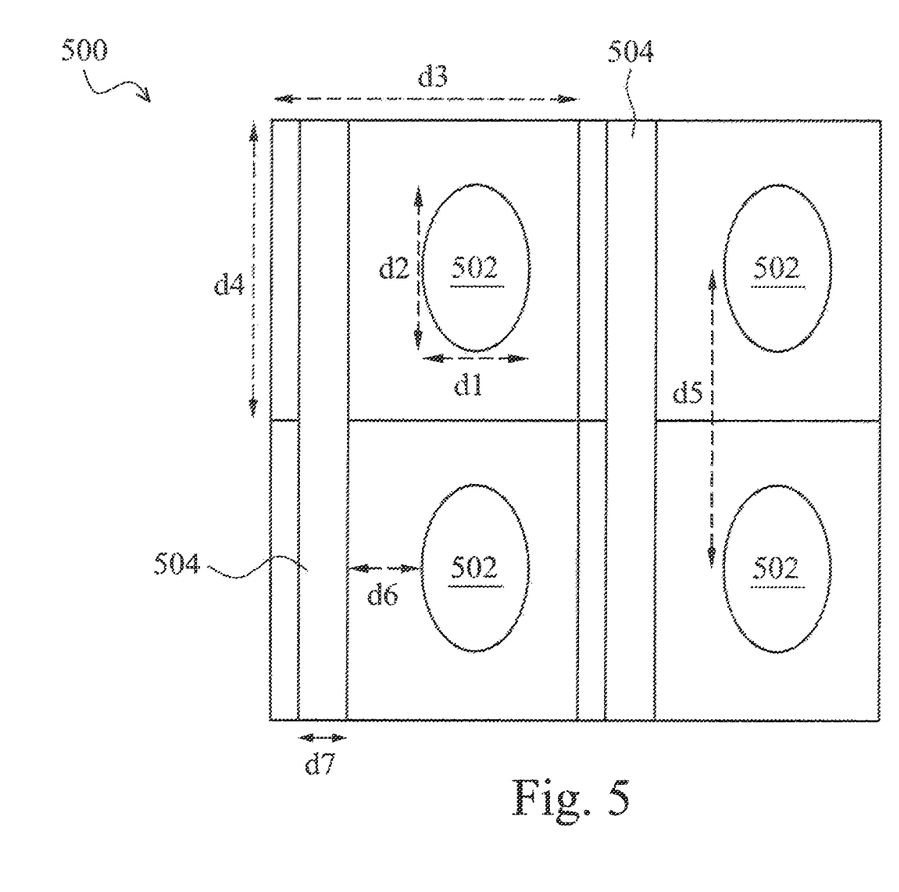
FIG. 5 is a top view of a 2×2 array of the exemplary MRAM cells in FIG. 1 according to some embodiments.

FIG. 5 is a top view of a 2×2 array of the exemplary MRAM cells in FIG. 1 according to some embodiments. An MTJ 502 is depicted to have an oval or elliptic shape with a width d1 and length d2. In some embodiments, d2 can be about 2-3 times of d1, a cell width d3 can be about 3 times d1, and a cell length d4 can be about 2 times d2. The distance between the MTJs 502 d5 can be about 2 times d2.

An induction line 504 can be about 0.5-1 times of d1. In some embodiments, d1 is about 28-40 nanometers (nm), and the distance d6 between the MTJ 502 and the induction line 504 is about 30-50 nm. Even though a 2×2 array is depicted in FIG. 5, any size array can be made with the exemplary MRAM cell in FIG. 1.

Figure 6:
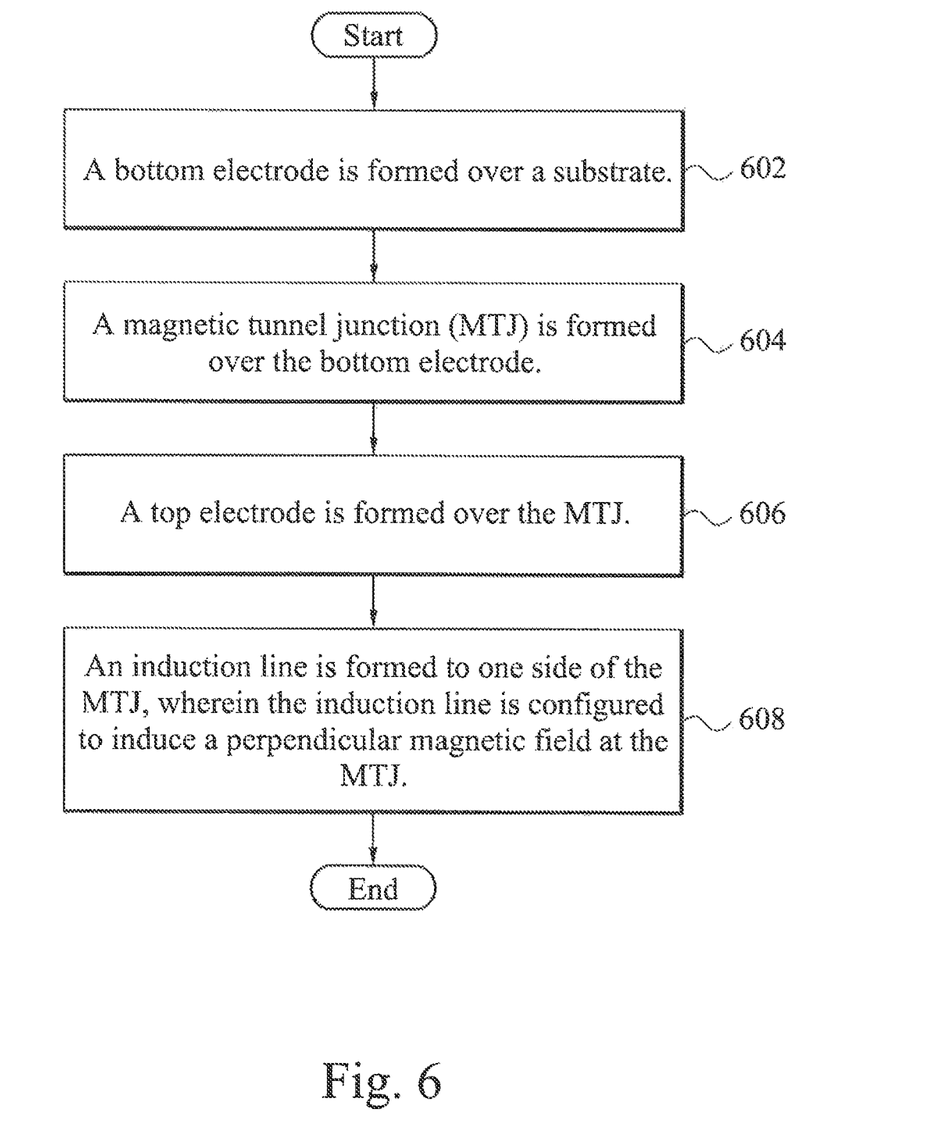
FIG. 6 is a flowchart of a method of fabricating the exemplary MRAM cell in FIG. 1 according to some embodiments.

FIG. 6 is a flowchart for a method of fabricating the exemplary MRAM cell in FIG. 1 according to some embodiments. At step 602, a bottom electrode is formed over a substrate. The bottom electrode may comprise electrically conductive materials such as copper, copper alloy, aluminum, aluminum/silicon/copper alloy, titanium, titanium nitride, tantalum, tantalum nitride, tungsten, polysilicon, metal silicide, any combinations thereof, or any other suitable material. The bottom electrode can be formed by a process including physical vapor deposition (PVD such as PVD by sputtering), chemical vapor deposition (CVD), plating, damascene processes, combinations thereof, or any other suitable processes.

At step 604, a magnetic tunnel junction (MTJ) is formed over the bottom electrode. The MTJ can be formed with thin film technology, such as magnetron sputter deposition, molecular beam epitaxy, pulsed laser deposition, electron beam physical vapor deposition, or any other suitable methods. The free layer of the MTJ comprises CoFeB, NiFe, or any other suitable magnetic material, the fixed layer of the MTJ comprises CoFe, CoFeB, or any other suitable magnetic material. The insulator of the MTJ comprises MgO, $Al_2O_3$, or any other suitable material.

At 606, a top electrode is formed over the MTJ. The top electrode may comprise electrically conductive materials such as copper, copper alloy, aluminum, aluminum/silicon/copper alloy, titanium, titanium nitride, tantalum, tantalum nitride, tungsten, polysilicon, metal silicide, any combinations thereof, or any other suitable material. The top electrode can be formed by a process similar to the bottom electrode as described above.

At 608, an induction line is formed to one side of the MTJ. The induction line is configured to induce a perpendicular magnetic field at the MTJ. In some embodiments, the induction line is formed from the same layer as the bottom electrode, the top electrode, and/or the MTJ in some embodiments by etching. The induction line may comprise electrically conductive materials such as copper, copper alloy, aluminum, aluminum/silicon/copper titanium, titanium nitride, tantalum, tantalum nitride, tungsten, polysilicon. metal silicide, any combinations thereof, or any other suitable material.

In various embodiments, the induction line is formed in the same layer as the top electrode, the bottom electrode, or the MTJ. Forming the MTJ comprises forming a fixed layer having a fixed magnetic polarity over the bottom electrode, forming an insulator over the fixed layer, and forming a free layer over the insulator having a changeable magnetic polarity. The free layer comprises CoFeB or NiFe. The fixed layer comprises CoFe or CoFeB. The insulator comprises MgO or $Al_2O_3$.

According to some embodiments, a magnetoresistive random access memory (MRAM) cell includes a magnetic tunnel junction (MTJ), a top electrode disposed over the MTJ, a bottom electrode disposed below the MTJ, and an induction line disposed to one side of the MTJ. The induction line is configured to induce a perpendicular magnetic field at the MTJ.

According to some embodiments, a method of fabricating a magnetoresistive random access memory (MRAM) cell includes forming a bottom electrode over a substrate. A magnetic tunnel junction (MTJ) is formed over the bottom electrode. A top electrode is formed over the MTJ. An induction line is formed to one side of the MTJ. The induction line is configured to induce a perpendicular magnetic field at the MTJ.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A magnetoresistive random access memory (MRAM) cell, comprising:
   a magnetic tunnel junction (MTJ);
   a top electrode disposed over the MTJ;
   a bottom electrode disposed below the MTJ; and
   an induction line disposed to one side of the MTJ,
   wherein the induction line is configured to induce a perpendicular magnetic field at the MTJ.

2. The MRAM cell of claim 1, wherein the induction line is formed in the same layer as the top electrode.

3. The MRAM cell of claim 1, wherein the induction line is formed in the same layer as the bottom electrode.

4. The MRAM cell of claim 1, wherein the induction line is formed in the same layer as the MTJ.

5. The MRAM cell of claim 1, wherein the MTJ comprises a free layer, a fixed layer, and an insulator disposed between the free layer and the fixed layer, the fixed layer has a fixed magnetic polarity, and the free layer has a changeable magnetic polarity.

6. The MRAM cell of claim 5 wherein the free layer comprises CoFeB or NiFe.

7. The MRAM cell of claim 5, wherein the fixed layer comprises CoFe or CoFeB.

8. The MRAM cell of claim 5 wherein the insulator comprises MgO or $Al_2O_3$.

9. The MRAM cell of claim 1, wherein the MTJ has an oval or elliptic shape.

10. The MRAM cell of claim 1, wherein the MRAM cell is a spin transfer torque (STT) MRAM cell.

11. A method of fabricating a magnetoresistive random access memory (MRAM) cell, comprising:
    forming a bottom electrode over a substrate;
    forming a magnetic tunnel junction (MTJ) over the bottom electrode;
    forming a top electrode over the MTJ; and
    forming an induction line disposed to one side of the MTJ, wherein the induction line is configured to induce a perpendicular magnetic field at the MTJ.

12. The method of claim 11, wherein the induction line is formed in the same layer as the top electrode.

13. The method of claim 11, wherein the induction line is formed in the same layer as the bottom electrode.

14. The method of claim 11, wherein the induction line is formed in the same layer as the MTJ.

15. The method of claim 11, wherein forming the MTJ comprises:
    forming a fixed layer having a fixed magnetic polarity over the bottom electrode;
    forming an insulator over the fixed layer; and
    forming a free layer over the insulator having a Changeable magnetic polarity.

16. The method of claim 15, wherein the free layer comprises CoFeB or NiFe.

17. The method of claim 15, wherein the fixed layer comprises CoFe or CoFeB.

18. The method of claim 15, wherein the insulator comprises MgO or $Al_2O_3$.

19. A magnetoresistive random access memory (MRAM) cell, comprising:
    a magnetic tunnel junction (MTJ) including a free layer, a fixed layer, and an insulator disposed between the free layer and the fixed layer, wherein the fixed layer has a fixed magnetic polarity, and the free layer has a changeable magnetic polarity;
    a top electrode disposed over the MTJ;
    a bottom electrode disposed below the MTJ; and
    an induction line disposed to one side of the MTJ,
    wherein the induction line is configured to induce a perpendicular magnetic field at the MTJ and the MTJ has an oval or elliptic shape.

20. The MRAM cell of claim 19, wherein the MTJ is above a via.

* * * * *